US012625102B2

(12) United States Patent
Lee

(10) Patent No.: US 12,625,102 B2
(45) Date of Patent: May 12, 2026

(54) RESISTANCE MEASURING APPARATUS AND RESISTANCE MEASURING METHOD BASED ON THE SAME

(71) Applicant: SEMES CO., LTD., Chungcheongnam-do (KR)

(72) Inventor: Kiryong Lee, Pyeongtaek-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 212 days.

(21) Appl. No.: 18/387,343

(22) Filed: Nov. 6, 2023

(65) Prior Publication Data

US 2024/0151670 A1     May 9, 2024

(30) Foreign Application Priority Data

Nov. 7, 2022     (KR) ........................ 10-2022-0147374

(51) Int. Cl.
  *G01N 27/04*     (2006.01)
  *G01R 19/00*     (2006.01)
  *G01R 27/02*     (2006.01)
  *G01R 27/14*     (2006.01)
  *G01R 31/28*     (2006.01)
  (Continued)

(52) U.S. Cl.
  CPC ....... *G01N 27/041* (2013.01); *G01R 19/0092* (2013.01); *G01R 27/02* (2013.01); *G01R 27/14* (2013.01); *G01R 31/2831* (2013.01); *H02J 3/36* (2013.01); *H02J 3/381* (2013.01); *H02J 2203/20* (2020.01)

(58) Field of Classification Search
  CPC ...... G01N 27/041; G01R 27/02; G01R 27/14; G01R 19/0092; G01R 31/2831; G01R 31/2837; H02J 3/36; H02J 2203/20; H02J 3/381

USPC ......................................................... 324/691
See application file for complete search history.

(56) References Cited

U.S. PATENT DOCUMENTS

2004/0239347 A1* 12/2004 Yamada ................ H01J 37/256
                                                    324/754.22
2007/0268027 A1* 11/2007 Olsen .................... G01N 27/043
                                                    324/691
2019/0025244 A1*  1/2019 Okamoto ........... G01N 27/4076
                              (Continued)

FOREIGN PATENT DOCUMENTS

JP         10-273338         10/1998
JP         11-223646          8/1999
                 (Continued)

OTHER PUBLICATIONS

JP 200088900 machine translation, Mar. 31, 2000 (Year: 2000).*
                    (Continued)

*Primary Examiner* — Raul J Rios Russo
(74) *Attorney, Agent, or Firm* — WOMBLE BOND DICKINSON (US) LLP

(57)          ABSTRACT

A method of measuring resistance of a specimen including a specimen electrode includes forming a center electrode and an edge electrode in at least a partial region on an upper surface of the specimen, transmitting, by a power supply, current to the specimen electrode, the center electrode, and the edge electrode, measuring, by an ammeter, the current flowing between the specimen electrode and the center electrode, and removing the center electrode and the edge electrode from the upper surface of the specimen.

20 Claims, 12 Drawing Sheets

(51) Int. Cl.
*H02J 3/36* (2006.01)
*H02J 3/38* (2006.01)

(56) References Cited

U.S. PATENT DOCUMENTS

| | | | | |
|---|---|---|---|---|
| 2021/0104426 A1* | 4/2021 | Kawanabe | ............. | H02N 13/00 |
| 2022/0373582 A1* | 11/2022 | Yukawa | ............. | G01R 27/2641 |
| 2024/0145479 A1* | 5/2024 | Hong | .................... | G01R 27/02 |

FOREIGN PATENT DOCUMENTS

| | | |
|---|---|---|
| JP | 2000-88900 | 3/2000 |
| JP | 2004-273932 | 9/2004 |
| JP | 2014-196956 | 10/2014 |
| KR | 10-1989-0004584 | 4/1989 |
| KR | 10-2008-0056088 | 6/2008 |
| KR | 10-2014-0117034 | 10/2014 |
| KR | 10-2019-0014284 | 2/2019 |
| KR | 10-2077774 | 2/2020 |

OTHER PUBLICATIONS

JP 2004273932 machine translation, Sep. 30, 2004 (Year: 2004).*
JP H10273338 machine translation, Oct. 13, 1998 (Year: 1998).*
KR 20080056088 machine translation, Jun. 20, 2008 (Year: 2008).*
Office Action dated Jul. 30, 2024 for Korean Patent Application No. 10-2022-0147374 and its English translation by Google Translate.
Notice of Allowance dated Jan. 17, 2025 for Korean Patent Application No. 10-2022-0147374.

* cited by examiner

S10

START

FORM CENTER ELECTRODE AND EDGE
ELECTRODE ON UPPER SURFACE OF
SPECIMEN INCLUDING SPECIMEN ELECTRODE — S11

TRANSMIT CURRENT TO SPECIMEN ELECTRODE,
CENTER ELECTRODE, AND EDGE ELECTRODE — S12

MEASURE CURRENT FLOWING BETWEEN
SPECIMEN ELECTRODE AND CENTER ELECTRODE — S13

REMOVE CENTER ELECTRODE AND EDGE
ELECTRODE — S14

END

RESISTANCE MEASURING APPARATUS AND RESISTANCE MEASURING METHOD BASED ON THE SAME

CROSS-REFERENCE TO RELATED APPLICATION

This application is based on and claims priority under 35 U.S.C. § 119 to Korean Patent Application No. 10-2022-0147374, filed on Nov. 7, 2022, in the Korean Intellectual Property Office, the disclosure of which is incorporated by reference herein in its entirety.

BACKGROUND

1. Field

The disclosure relates to a resistance measuring apparatus and a resistance measuring method based on the same.

2. Description of the Related Art

Semiconductor devices may be generally manufactured through various processes such as an oxidation process, a photo process, an etching process, and a deposition process. An electrostatic chuck or heater configured to support a substrate in various processes in a semiconductor manufacturing facility may be provided. As the degree of integration of semiconductor devices increases, the importance of fine patterning increases. During substrate processing, when substrate support is unstable or temperature heating is non-uniform, it may be difficult to form fine patterns, and thus, a high quality electrostatic chuck or heater is required.

SUMMARY

The disclosure provides a resistance measuring apparatus capable of measuring the volume resistance of a specimen without destroying the specimen and a resistance measuring method based on the resistance measuring apparatus.

The disclosure also provides a resistance measuring apparatus capable of measuring the volume resistance of a part of a specimen and a resistance measuring method based on the resistance measuring apparatus.

In addition, the problem to be solved by the technical spirit of the disclosure is not limited to the above-mentioned problems, and other problems may be clearly understood by those skilled in the art from the description below.

Additional aspects will be set forth in part in the description which follows and, in part, will be apparent from the description, or may be learned by practice of the presented embodiments of the disclosure.

According to an aspect to the disclosure, a method of measuring resistance of a specimen including a specimen electrode includes forming a center electrode and an edge electrode in at least a partial region on an upper surface of the specimen, transmitting, by a power supply, current to the specimen electrode, the center electrode, and the edge electrode, measuring, by an ammeter, the current flowing between the specimen electrode and the center electrode, and removing the center electrode and the edge electrode from the upper surface of the specimen.

According to an aspect to the disclosure, a resistance measuring apparatus of a specimen including a specimen electrode includes a center electrode and an edge electrode configured to be detachable from an upper surface of the specimen, a power supply configured to supply power to the specimen electrode, the center electrode, and the edge electrode, and an ammeter configured to measure current between the specimen and the center electrode, wherein the edge electrode is spaced apart from the center electrode and surrounds the center electrode.

According to an aspect to the disclosure, a resistance measuring apparatus of a ceramic specimen including a specimen electrode includes a center electrode and an edge electrode configured to be detachable from an upper surface of the specimen and formed by applying a liquid electrode in a spray manner, a power supply configured to supply power to the specimen electrode, the center electrode, and the edge electrode, and an ammeter configured to measure current between the specimen and the center electrode, wherein the ceramic specimen includes a ceramic electrostatic chuck or a ceramic heater, an area of an upper surface of the center electrode is smaller than an area of the upper surface of the specimen, and the edge electrode is spaced apart from the center electrode and surrounds the center electrode.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
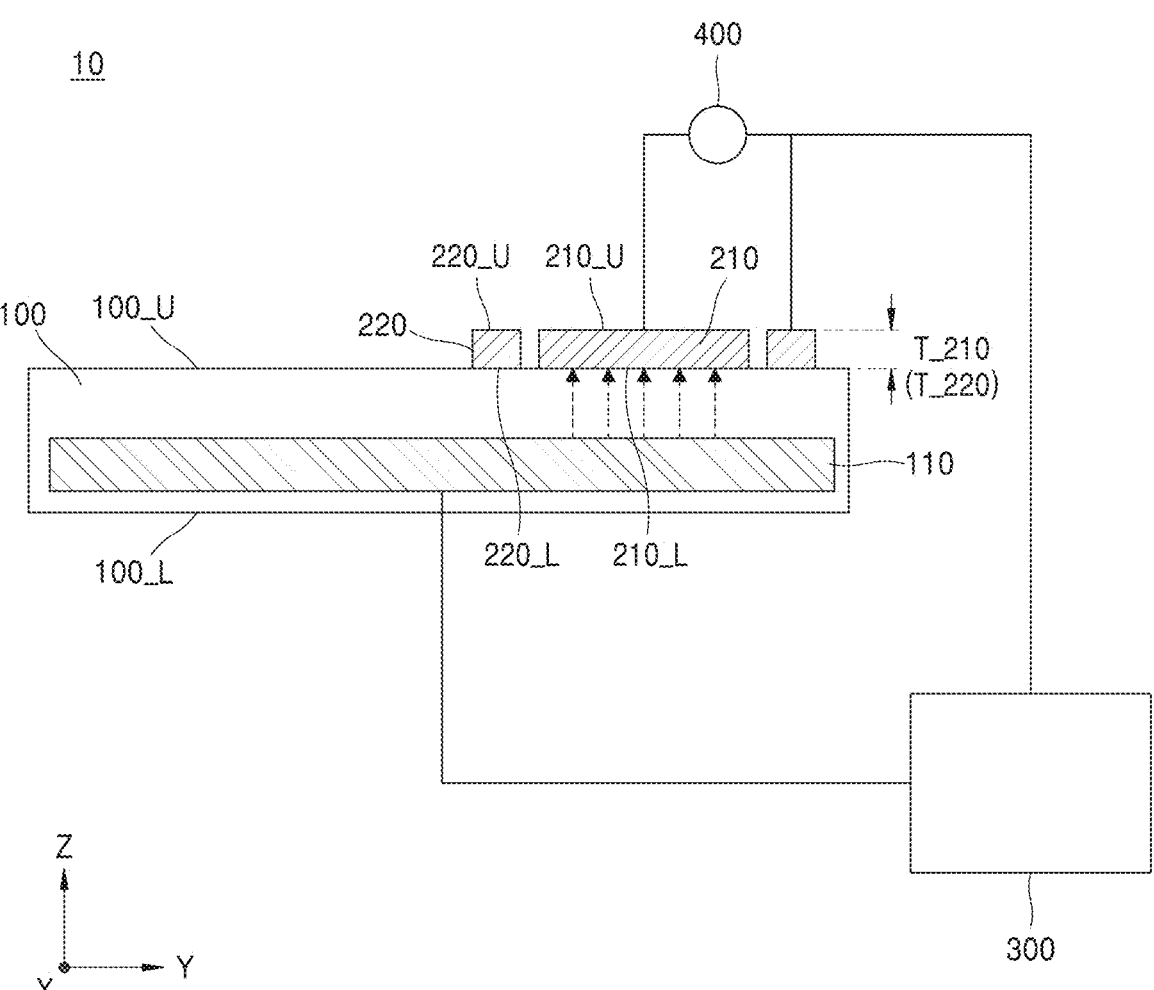
FIG. 1 is a structure schematically illustrating a resistance measuring apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Although terms used in the embodiments are selected from general terms currently widely used under consideration of functions in the disclosure, the terms may vary according to the intention of those of ordinary skill in the art, judicial precedents, or introduction of new technology. In addition, in a specific case, the applicant voluntarily may select terms, and in this case, the meaning of the terms may be disclosed in a corresponding description part. Thus, the terms used herein should be defined not by the simple names of the terms but by the meaning of the terms and the contents throughout the embodiments.

Because the embodiments may have various changes and various forms, some embodiments will be illustrated in the drawings and described in detail. However, this is not intended to limit the embodiments to a specific disclosure, and should be understood to include all changes, equivalents, or substitutes included in the spirit and scope of the embodiments. Terms used in the specification are only used for description of the embodiments, and are not intended to limit the embodiments.

Figure 2:
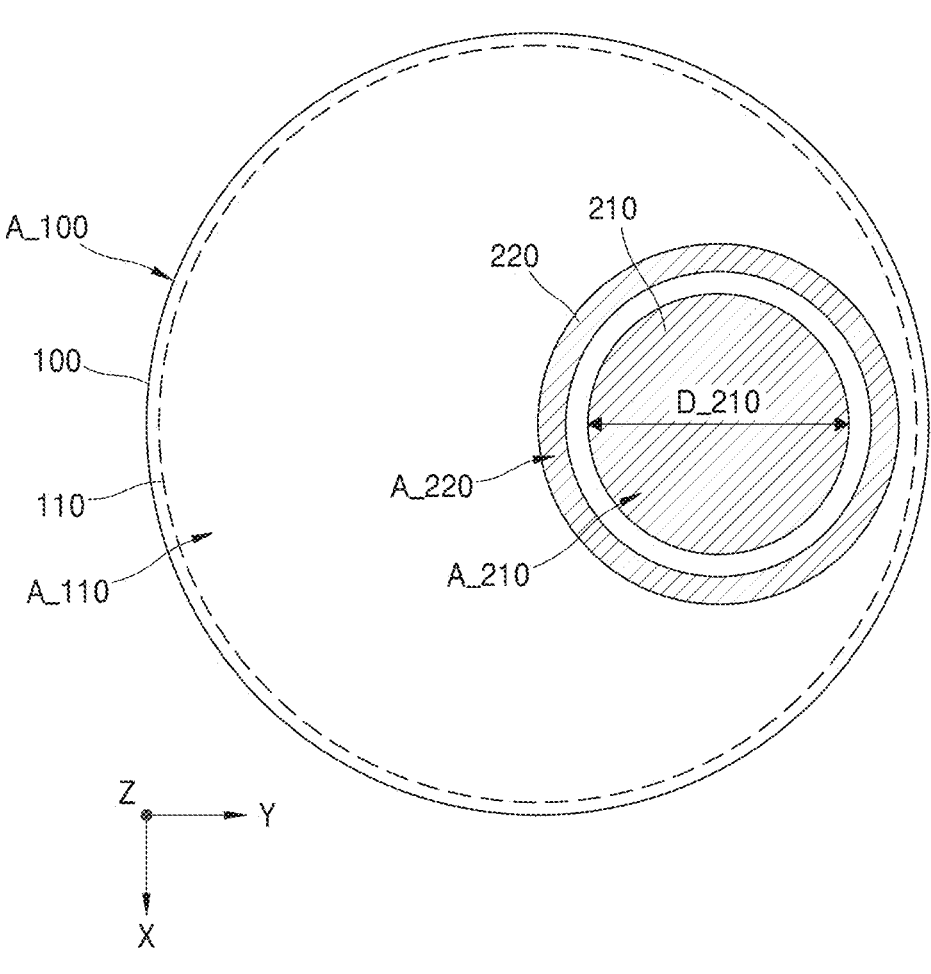
FIG. 2 is a plan view schematically illustrating the resistance measuring apparatus of FIG. 1.

FIG. 1 is a structure schematically illustrating a resistance measuring apparatus 10 according to an embodiment. FIG. 2 is a plan view schematically illustrating the resistance measuring apparatus 10 of FIG. 1.

Referring to FIGS. 1 and 2, the resistance measuring apparatus 10 may include a center electrode 210, an edge electrode 220, a power supply 300, and an ammeter 400. FIG. 2 omits the ammeter 400 and the power supply 300 and schematically illustrates the relationship between a specimen 100, the center electrode 210, and the edge electrode 220.

The resistance measuring apparatus 10 may measure the resistance of the specimen 100 including a specimen electrode 110. In other words, the resistance measuring apparatus 10 may measure the resistance of the specimen 100 including a non-detachable electrode. In some embodiments, the specimen electrode 110 may be included in the specimen 100. In some embodiments, the specimen electrode 110 may be attached to a lower surface 100_L of the specimen 100. In some embodiments, a material forming between the upper surface 100_U of the specimen 100 and the specimen electrode 110 may include ceramic. That is, a material constituting a part of the specimen 100 may include ceramic.

In some embodiments, the specimen 100 may be either a ceramic electrostatic chuck (ESC) or a ceramic heater. That is, the specimen 100 may be a piece of equipment including an electrode therein. When the resistance measuring apparatus 10 of the disclosure measures the resistance of the equipment including the electrode therein, a state of the equipment before measuring the resistance and a state of the equipment after measuring the resistance may be the same. That is, the resistance measuring apparatus 10 of the disclosure may measure the resistance of the equipment without destroying the equipment.

The center electrode 210 and the edge electrode 220 of the resistance measuring apparatus 10 may be positioned on the upper surface 100_U of the specimen 100. The center electrode 210 and the edge electrode 220 may be attached to or detached from the upper surface 100_U of the specimen 100. In other words, the center electrode 210 and the edge electrode 220 may be formed on or may be removed from the upper surface 100_U of the specimen 100. That is, the center electrode 210 and the edge electrode 220 may be formed before measuring the resistance of the specimen 100 and may be removed after measuring the resistance. In some embodiments, a thickness T_210 of the center electrode 210 may be about 10 μm to about 800 μm, and a thickness T_220 of the edge electrode 220 may be about 10 μm to about 800 μm.

The edge electrode 220 may be spaced apart from the center electrode 210. The edge electrode 220 may surround the center electrode 210. That is, the edge electrode 220 may not directly contact the center electrode 210. In some embodiments, an upper surface 210_U of the center electrode 210 may have a circular shape, and an upper surface 220_U of the edge electrode 220 may have a ring shape. That is, the center electrode 210 may have a circular shape, and the edge electrode 220 may have a ring shape spaced apart from an end of the center electrode 210 by a certain distance.

In some embodiments, the center electrode 210 may have a circular shape and the edge electrode 220 may have a ring shape. In some embodiments, a diameter D_210 of the center electrode 210 may be about 40 mm to about 55 mm. In FIG. 2, the center electrode 210 is illustrated as having a circular shape, but is not limited thereto, and the center electrode 210 may have a polygonal shape such as a triangular shape or a quadrangular shape.

In some embodiments, the center electrode 210 and the edge electrode 220 may be liquid electrodes. The center electrode 210 and the edge electrode 220 may be sprayed onto the upper surface 100_U of the specimen 100 in a spray manner. In some embodiments, the center electrode 210 and the edge electrodes 220 may be graphite spray. In some embodiments, the resistance of the center electrode 210 may range from about 1000 ohms to about 2000 ohms. The resistance of the edge electrode 220 may range from about 1000 ohms to 2000 ohms.

In some embodiments, the center electrode 210 and the edge electrode 220 each may be a conductive rubber. That is, the center electrode 210 and the edge electrode 220 may be attached with the conductive rubber or sprayed in the form of a liquid and formed on the upper surface 100_U of the specimen 100. In some embodiments, the resistance of the center electrode 210 may range from about 1000 ohms to about 2000 ohms. The resistance of the edge electrode 220 may range from about 1000 ohms to 2000 ohms.

The edge electrode 220 of the disclosure may prevent current from flowing to a surface of a region where the center electrode 210 and the specimen 100 come into contact. In other words, the edge electrode 220 may surround the center electrode 210 to prevent current from flowing on a surface of the specimen 100 around the center electrode 210.

In some embodiments, an area A_210 of the upper surface 210_U of the center electrode 210 may be smaller than an area A_100 of the upper surface 100_U of the specimen 100. In other words, the center electrode 210 may be formed on at least a part of the upper surface 100_U of the specimen 100. That is, the center electrode 210 may overlap a part of the specimen 100. In some embodiments, the center electrode 210 may be removed after measuring the resistance, and formed again at another location, so that the resistance measuring apparatus 10 may also measure the resistance of the specimen 100 at another location.

The resistance measuring apparatus 10 may measure the resistance of the specimen 100 filling between the center electrode 210 and the specimen electrode 110. Accordingly, the resistance measuring apparatus 10 may measure the resistance of the specimen 100 in a region where the center electrode 210 overlaps the specimen 100. In other words, the resistance of a part of the specimen 100 may be measured through the resistance measuring apparatus 10 where the area A_210 of the upper surface 210_U of the center electrode 210 is smaller than the area A_100 of the upper surface 100_U of the specimen 100. That is, the resistance measuring apparatus 10 may measure the volume resistance of a certain region of the specimen 100, thereby precisely measuring the volume resistance of the specimen 100.

In some embodiments, an area A_110 of the specimen electrode 110 may be greater than a sum of the area A_210 of the upper surface 210_U of the center electrode 210 and an area A_220 of the upper surface 220_U of the edge electrode 220. The specimen electrode 110 may be located inside the specimen 100, so that the area A_110 of the specimen electrode 110 may be substantially the same as the area A_100 of the upper surface 100_U of the specimen 100. In other words, the specimen electrode 110 may be located inside a region of the specimen 100 where the center electrode 210 and the edge electrode 220 are located.

In some embodiments, when the center electrode 210 is formed on a part of the upper surface 100_U of the specimen 100, because the area A_100 of the upper surface 100_U of the specimen 100 and the area A_110 of the specimen electrode 110 are substantially the same, the area A_210 of the upper surface 210_U of the center electrode 210 may be smaller than the area A_110 of the specimen electrode 110.

Typically, when measuring the resistance of the specimen 100, an inspection object is destroyed according to the size of the center electrode 210, so that the center electrode 210 has substantially the same size as the specimen 100. The area A_100 of the upper surface 100_U of the specimen 100 is larger than the area A_210 of the upper surface 210_U of the center electrode 210, and thus, the resistance measuring apparatus 10 of the disclosure may measure the resistance of the specimen 100 without destroying the specimen 100. In addition, the center electrode 210 may be attached to or detached from the specimen 100, and thus, the resistance measuring apparatus 10 of the disclosure may measure the resistance of the specimen 100 for each desired region.

The power supply 300 of the resistance measuring apparatus 10 may be connected to the specimen electrode 110, the center electrode 210, and the edge electrode 220. The power supply 300 may provide power to the specimen electrode 110, the center electrode 210, and the edge electrode 220. In some embodiments, in the power supply 300, a voltage of the edge electrode 220 may be the same as a voltage of the center electrode 210, and a voltage of the specimen electrode 110 may be different from the voltage of the center electrode 210.

In some embodiments, the power supply 300 may transmit direct current to the specimen electrode 110, the center electrode 210, and the edge electrode 220. In some embodiments, the power supply 300 may include a high voltage direct current (HVDC) transmission system. The HVDC transmission system is a system that transmits a large quantity of direct current.

The power supply 300 of the disclosure may transmit a high-voltage direct current to the specimen electrode 110, the center electrode 210, and the edge electrode 220, so that the current may flow between the specimen electrode 110 and the center electrode 210. The specimen 100 may be ceramic with high resistance, and the center electrode 210 may be an electrode with high resistance formed through graphite spraying. In order to make current flow through these high-resistance objects, the power supply 300 may include the HVDC transmission system.

The ammeter 400 of the resistance measuring apparatus 10 may measure a current flowing between the specimen 100 and the center electrode 210. In FIG. 1, part of the current in an embodiment is indicated by an arrow that is a dashed line. In some embodiments, the center electrode 210 and the edge electrode 220 may be connected in parallel to the power supply 300, and the ammeter 400 may be installed in series with a wire where the center electrode 210 is located. That is, the ammeter 400 may be connected in series to the wire of the center electrode 210 to measure current flowing from the specimen electrode 110 to the center electrode 210.

The resistance measuring apparatus 10 of the disclosure may calculate the volume resistance of at least a part of the specimen 100 based on the voltage supplied by the power supply 300 and a value measured by the ammeter 400. Specifically, the resistance measuring apparatus 10 of the disclosure may calculate the resistance of the specimen 100 through R=V/I which is the Ohm's law. However, the resistance measuring apparatus 10 of the disclosure may calculate an accurate resistance value of the specimen 100 by additionally calculating variables such as resistance of each electrode. In addition, the volume resistance of the specimen 100 may be calculated through $Rv=R \cdot A/t$ which is a volume resistance equation. Here, Rv denotes the volume resistance of the specimen 100, R denotes the resistance of the specimen 100, A denotes the area A_210 of the upper surface 210_U of the center electrode 210, and t may denote a distance from the upper surface 100_U of the specimen 100 to an upper surface of the specimen electrode 110. That is, t may be a depth of the specimen electrode 110 buried in the specimen 100.

In some embodiments, the center electrode 210 may be located in a partial region of the upper surface 100_U of the specimen 100, and thus, the resistance measuring apparatus 10 of the disclosure may measure the volume resistance of the specimen 100 with respect to the partial region of the specimen 100. While changing the position of the center electrode 210, the resistance measuring apparatus 10 may precisely measure the volume resistance of the specimen 100 for each region. In addition, because it is possible to remove the center electrode 210, the state of the specimen 100 after measuring the volume resistance of the specimen 100 and the state of the specimen 100 before measuring the volume resistance of the specimen 100 may be the same. In some embodiments, when the specimen 100 is an ESC, the resistance measuring apparatus 10 of the disclosure may precisely measure the volume resistance of the ceramic electrostatic chuck without destroying the ceramic electrostatic chuck, and thus, a function of the ceramic electrostatic chuck may not be lost after measuring the volume resistance of the ceramic electrostatic chuck.

Figure 3:
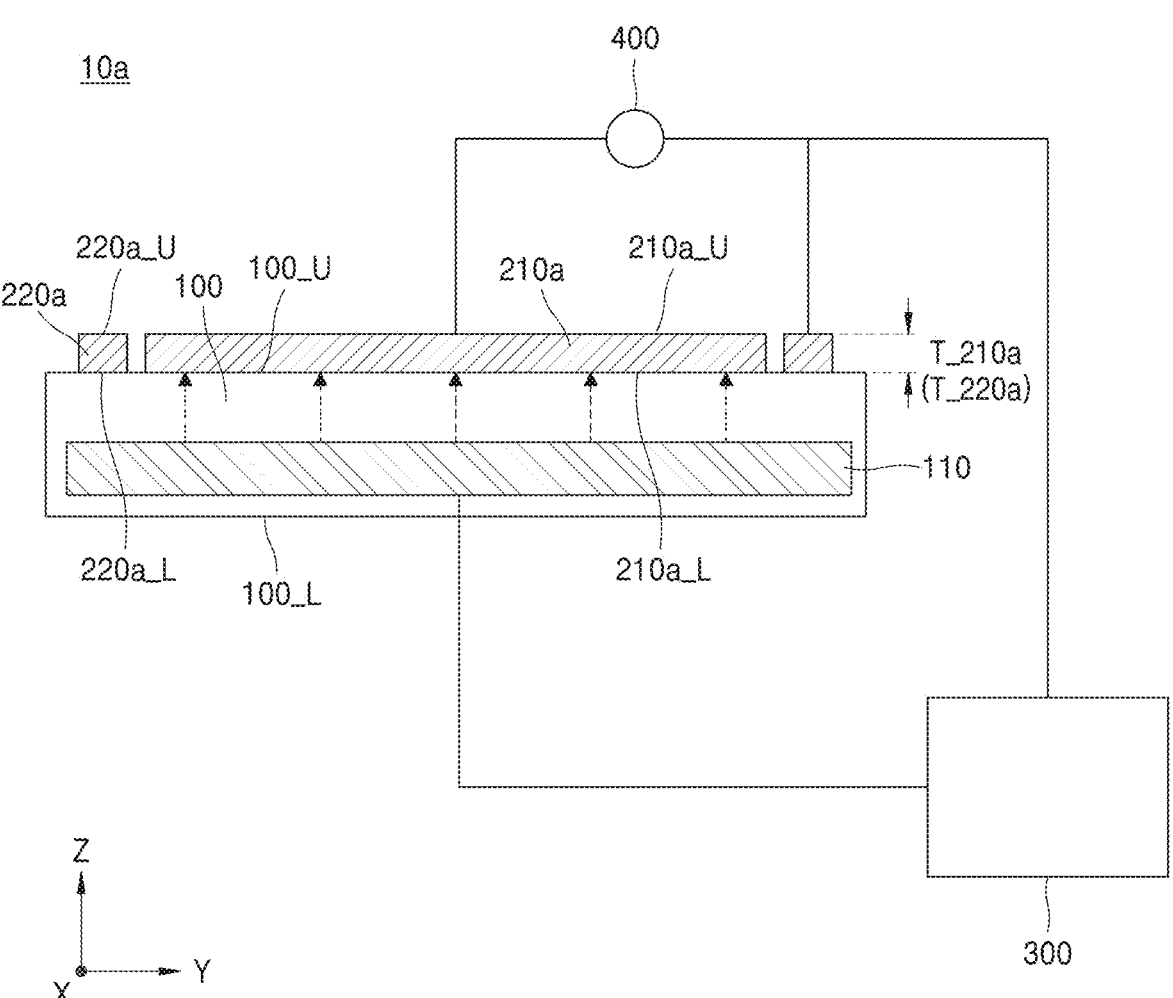
FIG. 3 is a structure schematically illustrating a resistance measuring apparatus according to an embodiment.

FIG. 3 is a structure schematically illustrating a resistance measuring apparatus according to an embodiment.

Hereinafter, redundant descriptions of the resistance measuring apparatus of FIG. 3 and the resistance measuring apparatus of FIG. 1 are omitted and differences are described.

Referring to FIG. 3, a resistance measuring apparatus 10a may include a center electrode 210a, an edge electrode 220a, the power supply 300, and the ammeter 400.

The resistance measuring apparatus 10a may measure the resistance of the specimen 100 including the specimen electrode 110. In some embodiments, the specimen electrode 110 may be included in the specimen 100. In some embodiments, the specimen 100 may be either an ESC or a ceramic heater. The specimen 100 may include the specimen 100 described with reference to FIG. 1.

The center electrode 210a and the edge electrode 220a of the resistance measuring apparatus 10a may be positioned on the upper surface 100_U of the specimen 100. The center electrode 210a and the edge electrode 220a may be attached to or detached from the upper surface 100_U of the specimen 100. In other words, the center electrode 210a and the edge electrode 220a may be formed on or may be removed from the upper surface 100_U of the specimen 100. That is, the center electrode 210a and the edge electrode 220a may be formed before measuring the resistance of the specimen 100 and may be removed after measuring the resistance. In some embodiments, a thickness T_210a of the center electrode 210 may be about 10 μm to about 800 μm, and a thickness T_220a of the edge electrode 220 may be about 10 μm to about 800 μm.

The edge electrode 220a may be spaced apart from the center electrode 210a. The edge electrode 220a may surround the center electrode 210a. That is, the edge electrode 220a may not directly contact the center electrode 210a. In some embodiments, an upper surface 210a_U of the center electrode 210a may have a circular shape, and an upper surface 220a_U of the edge electrode 220a may have a ring shape. That is, the center electrode 210a may have a circular shape, and the edge electrode 220a may have a ring shape spaced apart from an end of the center electrode 210a by a certain distance.

In some embodiments, an end of the edge electrode 220a may be positioned substantially on the same line as an end of the specimen electrode 110 in a vertical direction. That is, the end of the specimen electrode 110 may be positioned on an imaginary surface extending from the end of the edge electrode 220a.

In some embodiments, the sum of an area of the upper surface 210a_U of the center electrode 210a and an area of the edge electrode 220a may be substantially the same as an area of the specimen electrode 110. That is, the area of the upper surface 210a_U of the center electrode 210a and the area of the edge electrode 220a may be about 90% or more of the area of the specimen electrode 110. In some embodiments, the size of the specimen electrode 110 may be substantially equal to the size of the specimen 100, such that the sum of the area of the upper surface 210a_U of the center electrode 210a and the area of the edge electrode 220a may be substantially the same as an area of the upper surface 100_U of the specimen 100.

The resistance measuring apparatus 10a of the disclosure may include the center electrode 210a and the edge electrode 220a that are detachable from an upper portion of the specimen 100, and the specimen 100 may be in the same state before and after measuring the volume resistance of the specimen 100. In some embodiments, even if the specimen 100 is an apparatus including an electrode, a function of the apparatus may be maintained before and after measuring the volume resistance of the specimen 100.

Figure 4:
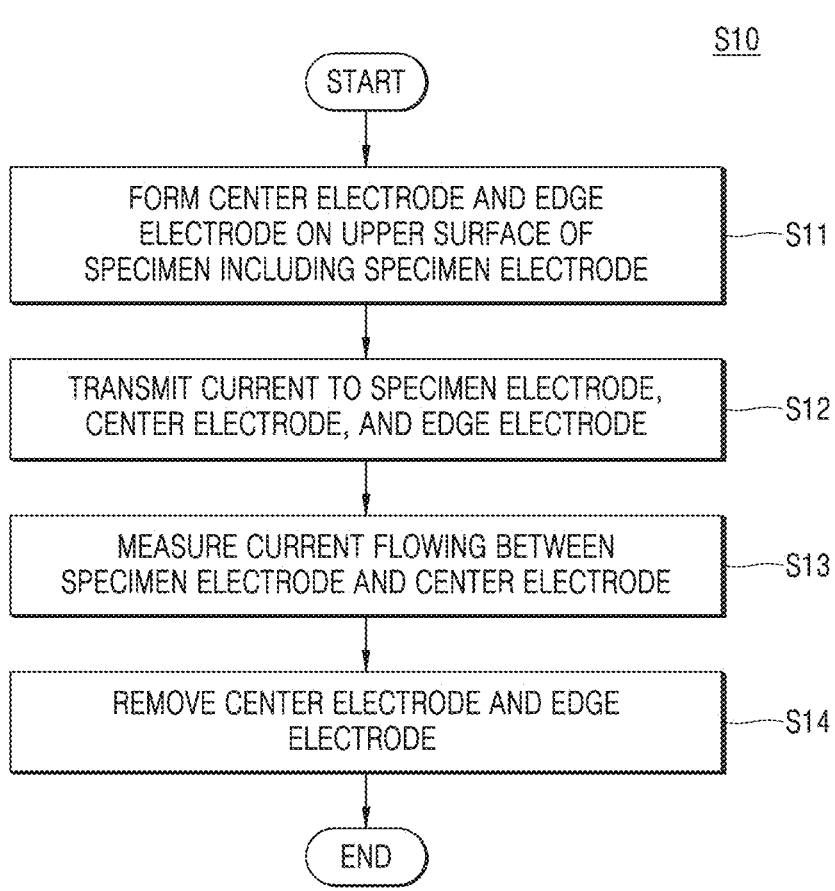
FIG. 4 is a flowchart illustrating a resistance measuring method according to an embodiment.

FIG. 4 is a flowchart illustrating a resistance measuring method according to an embodiment.

According to FIG. 4, the resistance measuring method S10 is a method of measuring the resistance of a specimen including a specimen electrode.

The resistance measurement method S10 may include forming a center electrode and an edge electrode on an upper surface of the specimen (operation S11). In some embodiments, the center electrode may be formed in a circular shape, and the edge electrode may be formed in a ring shape and surround the center electrode. In some embodiments, the resistance of the center electrode may be between about 1000 ohms and about 2000 ohms. The resistance of the edge electrode may be between about 1000 ohms and about 2000 ohms.

The resistance measurement method S10 may include transmitting current to the specimen electrode, the center electrode, and the edge electrode included in the specimen after forming the center and edge electrodes (operation S12). In some embodiments, the current may be transmitted to the specimen electrode, the center electrode, and the edge electrode through a power supply.

After transmitting the current, the current flowing between the specimen electrode and the center electrode may be measured (operation S13). In some embodiments, the current flowing between the specimen electrode and the center electrode may be measured through an ammeter. Specifically, the current may be measured by connecting the ammeter in series to a wire connected to the center electrode. In some embodiments, the resistance of the specimen may be calculated through a measured current value and a voltage value supplied from the power supply.

After calculating the resistance of the specimen by measuring the current, the center electrode and the edge electrode may be removed (operation S14). The center electrode and the edge electrode may be configured to be detachable from an upper surface of the specimen. The specimen from which the center electrode and the edge electrode are removed may be in the same state as the specimen before the resistance is measured.

Figure 5:
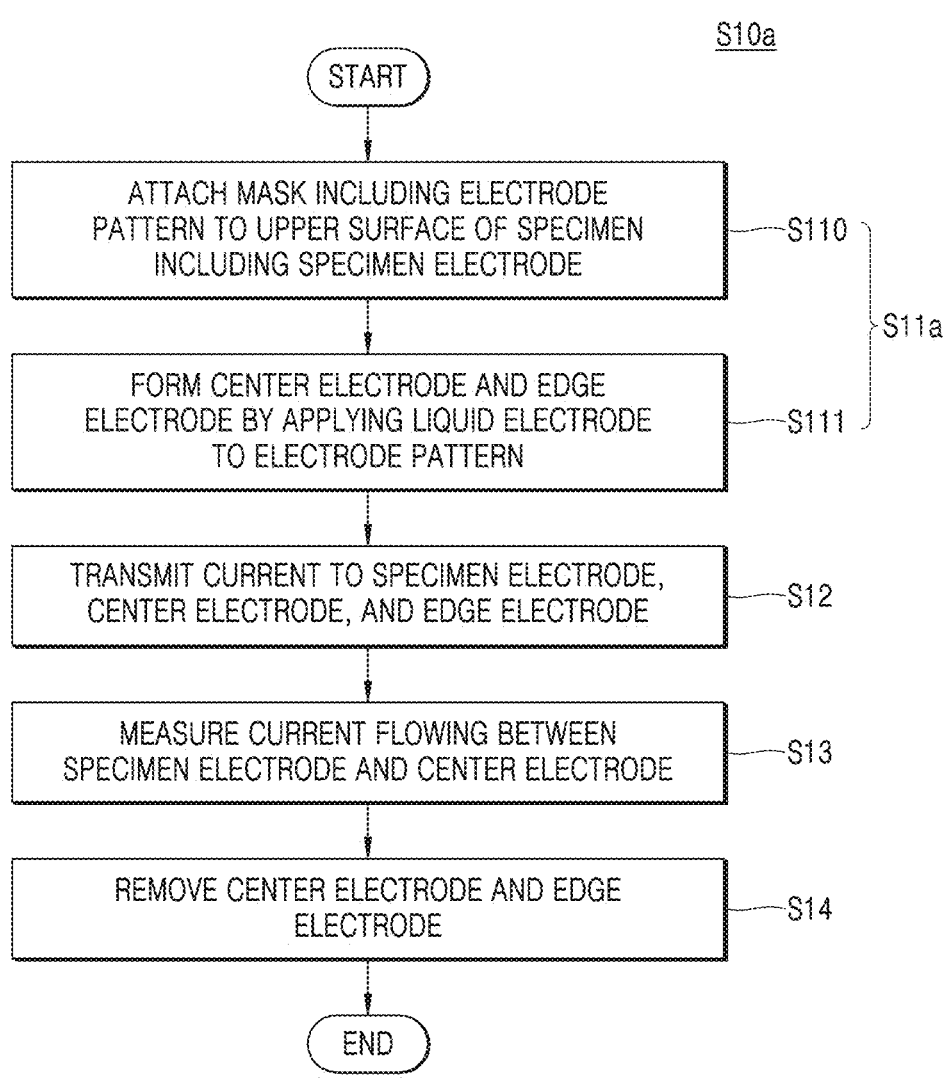
FIG. 5 is a flowchart illustrating a resistance measuring method according to an embodiment.
Figure 6:
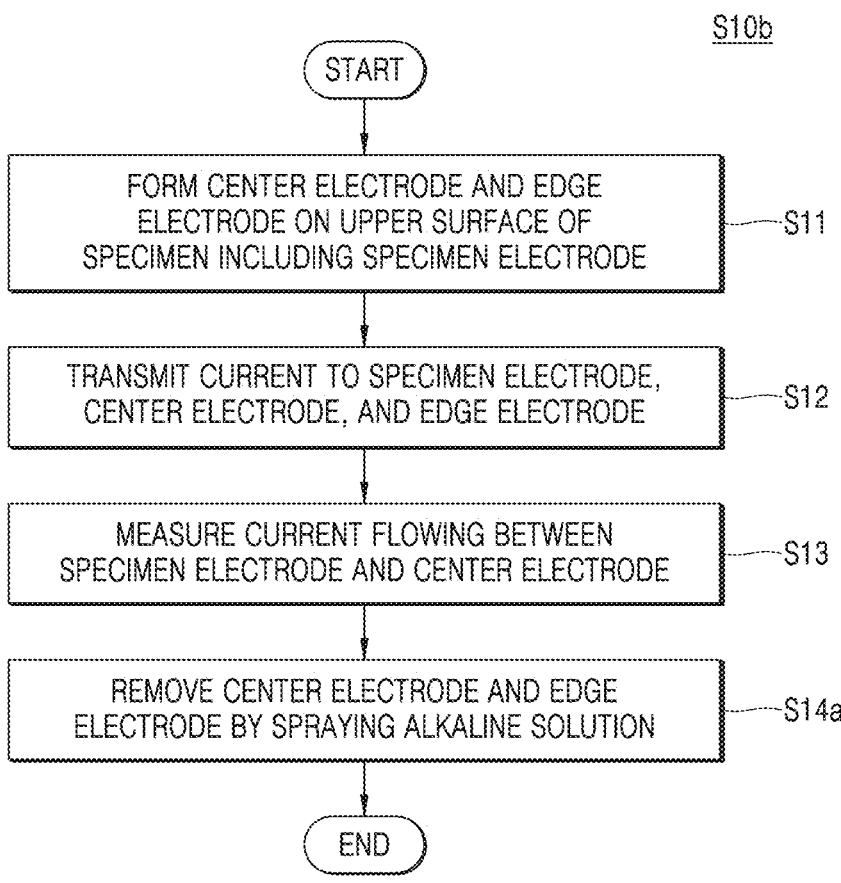
FIG. 6 is a flowchart illustrating a resistance measuring method according to an embodiment.

FIG. 5 is a flowchart illustrating a resistance measuring method according to an embodiment. FIG. 6 is a flowchart illustrating a resistance measuring method according to an embodiment.

Hereinafter, redundant descriptions of resistance measurement methods S10a and S10b of FIGS. 5 and 6 and the resistance measurement method S10 of FIG. 4 are omitted and differences are described.

Referring to FIG. 5, a process of forming a center electrode and an edge electrode (operation S11a) may include attaching a mask including an electrode pattern to an upper surface of a specimen (operation S110). Operation S11a may include forming a center electrode and an edge electrode by applying a liquid electrode to the electrode pattern after attaching the mask, (operation S111). That is, the center electrode and the edge electrode may be formed by applying the liquid electrode to the mask attached to the upper surface of the specimen.

Referring to FIG. 6, in an operation of removing the center electrode and the edge electrode, an alkaline solution or an alcohol solution may be sprayed onto the specimen (operation S14a). That is, the center electrode and the edge electrode may be dissolved in the alkaline solution or the alcohol solution, and thus, the center electrode and the edge electrode may be easily removed from the upper surface of the specimen by the alkaline solution or the alcohol solution.

FIGS. 7A to 7F are cross-sectional views sequentially illustrating a resistance measuring method according to an embodiment.

Hereinafter, the resistance measurement methods described with reference to FIGS. 4 to 6 are described with reference to FIGS. 7A to 7F.

Figure 7A:
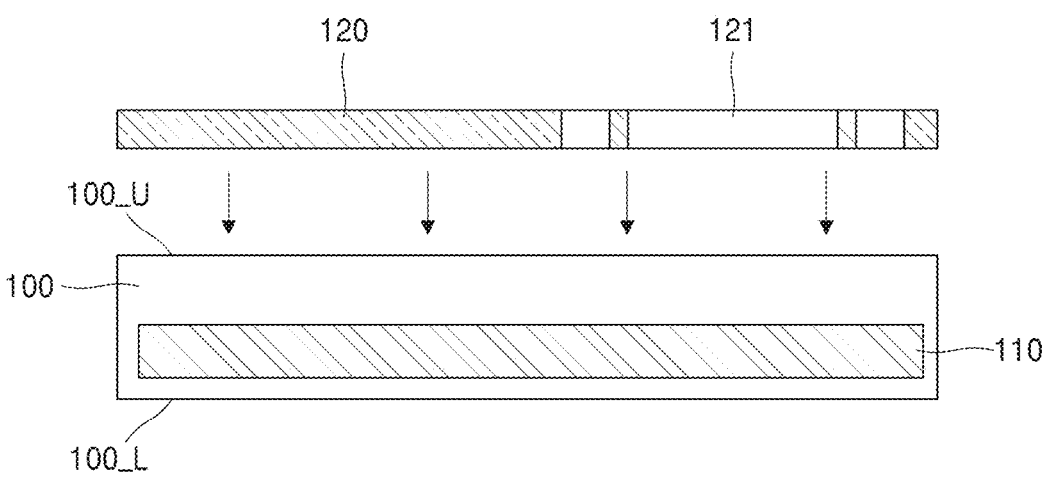
FIGS. 7A to 7F are cross-sectional views sequentially illustrating a resistance measuring method according to an embodiment.

FIG. 7A illustrates an operation of attaching a mask 120 including an electrode pattern 121 to the specimen 100.

Referring to FIG. 7A, the specimen 100 may include the specimen electrode 110. In other words, an inspection object, which is the specimen 100, may include a non-detachable electrode. In some embodiments, the specimen electrode 110 may be included in the specimen 100. In some embodiments, the specimen electrode 110 may be attached to the lower surface 100_L of the specimen 100.

In some embodiments, a material forming between the upper surface 100_U of the specimen 100 and the specimen electrode 110 may include ceramic. That is, a material constituting a part of the specimen 100 may include ceramic. In some embodiments, the specimen 100 may be either an ESC or a ceramic heater. That is, the specimen 100 may be a piece of equipment including an electrode therein.

The mask 120 may be attached to the upper surface 100_U of the specimen 100. The mask 120 may protect at least a part of the upper surface 100_U of the specimen 100 from the outside. A center electrode and an edge electrode may be formed on an electrode pattern 121 of the mask 120. In some embodiments, the electrode pattern 121 may be a hole. That is, the electrode pattern 121 may pass through an upper surface of the mask 120 and extend to a lower surface of the mask 120. In other words, the upper surface 100_U of the specimen 100 to which the mask 120 is attached may be exposed to the outside by the electrode pattern 121. In some embodiments, the electrode pattern 121 may include a circular hole and a ring-shaped hole. The center electrode may be formed in the circular hole, and the edge electrode may be formed in the ring-shaped hole. In some embodiments, a sidewall separating the two holes may be positioned between the circular hole and the ring-shaped hole. The side wall may be a separation space between the center electrode and the edge electrode. An area of the circular hole of the electrode pattern 121 may be smaller than an area of the upper surface 100_U of the specimen 100. That is, an area of an upper surface of the center electrode formed in the circular hole may be smaller than an area of the upper surface 100_U of the specimen 100.

Figure 7B:
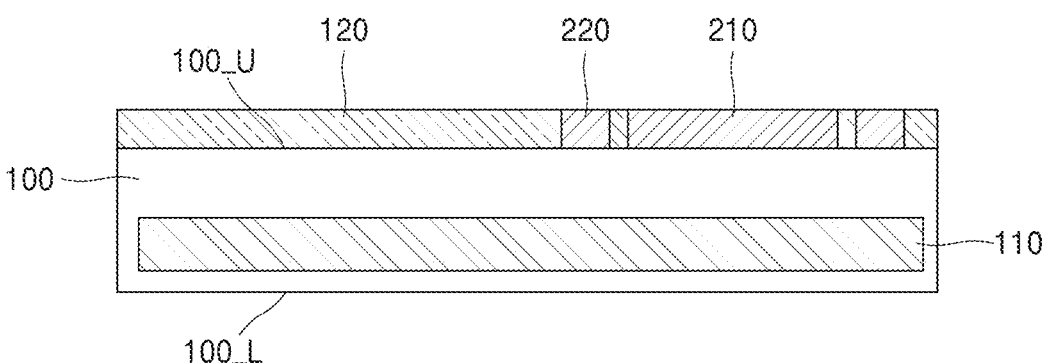
Figure 7C:
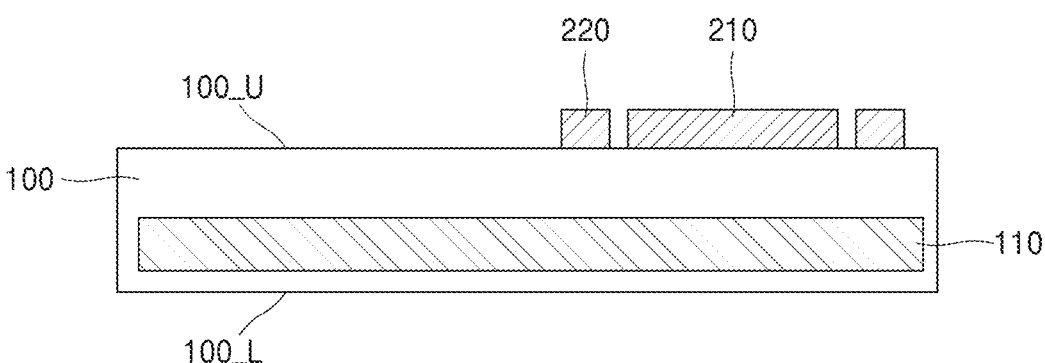

FIG. 7B illustrates a process of applying a liquid electrode to upper portions of the specimen 100 and the mask 120, and FIG. 7C illustrates a process of removing the mask 120 from the upper surface 100_U of the specimen 100. That is, FIGS. 7B and 7C illustrate the processes of forming the center electrode 210 and the edge electrode 220.

Referring to FIGS. 7B and 7C, the center electrode 210 and the edge electrode 220 may be formed by applying the liquid electrode to the electrode pattern 121. In some embodiments, the liquid electrode may be sprayed onto the specimen 100 and the mask 120 in a spray manner. The liquid electrode may fill the electrode pattern 121 by spraying the liquid electrode onto the upper portions of the specimen 100 and the mask 120. When the liquid electrode hardens, the mask 120 may be removed. When the mask 120 is removed, the center electrode 210 and the edge electrode 220 may be formed on a part of the upper surface 100_U of the specimen 100 exposed to the outside, that is, a part where the electrode pattern 121 is located.

The edge electrode 220 may be spaced apart from the center electrode 210. The edge electrode 220 may surround the center electrode 210. That is, the edge electrode 220 may not directly contact the center electrode 210. In some embodiments, the upper surface 210_U of the center electrode 210 may have a circular shape, and the upper surface 220_U of the edge electrode 220 may have a ring shape. That is, the center electrode 210 may have a circular shape, and the edge electrode 220 may have a ring shape spaced apart from an end of the center electrode 210 by a certain distance.

In some embodiments, the center electrode 210 may have a circular shape and the edge electrode 220 may have a ring shape. In some embodiments, a diameter of the center electrode 210 may be between about 40 mm and about 55 mm. In some embodiments, the resistance of the center electrode 210 may range from about 1000 ohms to 2000 ohms, and the resistance of the edge electrode 220 may range from about 1000 ohms to 2000 ohms. In some embodiments, the thickness T_210 in FIG. 7D of the center electrode 210 may be about 10 μm to about 800 μm, and the thickness T_220 in FIG. 7D of the edge electrode 220 may be about 10 μm to about 800 μm.

Figure 7D:
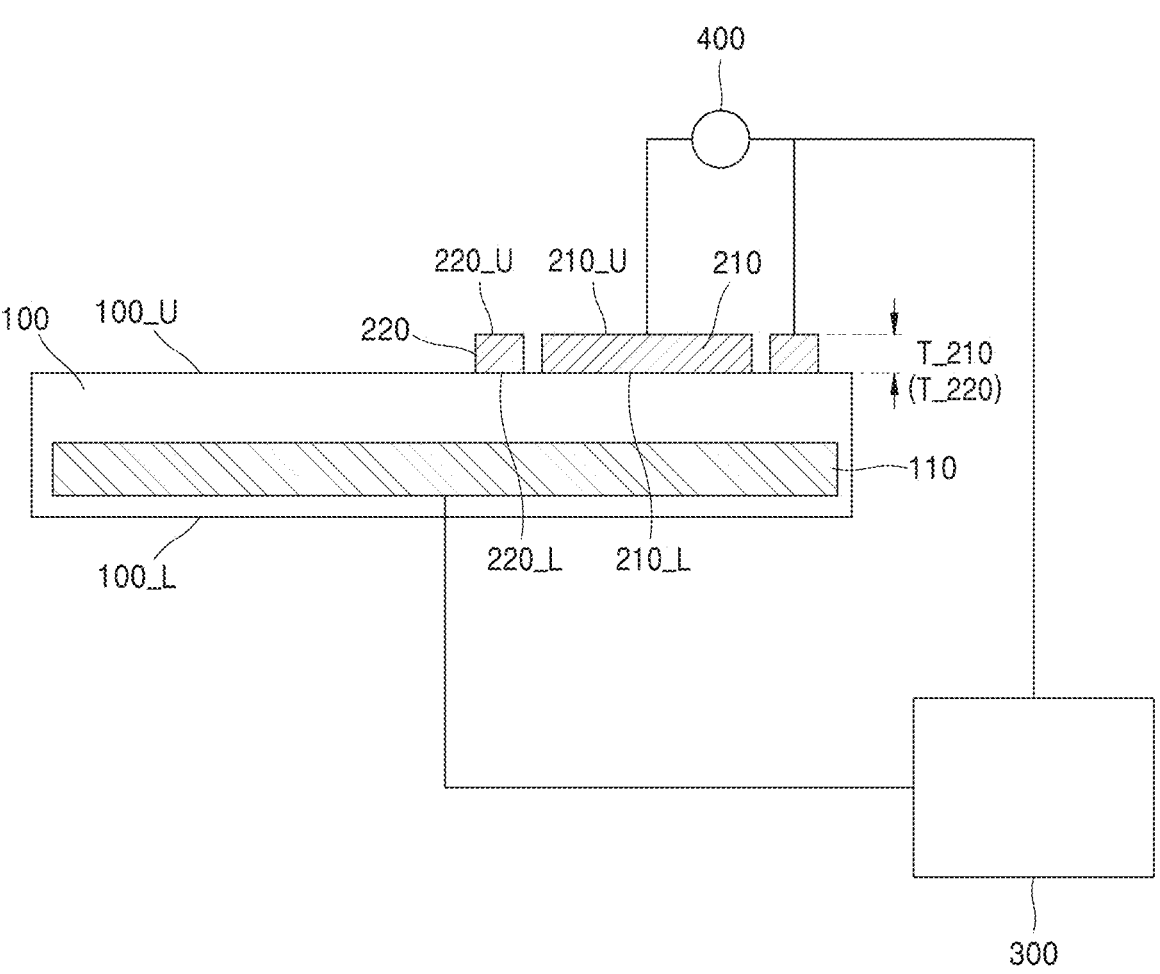

FIG. 7D illustrates a process of connecting the power supply 300 to the specimen electrode 110, the center electrode 210, and the edge electrode 220, and installing the ammeter 400 on a wire connected to the center electrode 210.

Referring to FIG. 7D, the power supply 300 of the resistance measuring apparatus may be connected to the specimen electrode 110, the center electrode 210, and the edge electrode 220. The power supply 300 may provide power to the specimen electrode 110, the center electrode 210, and the edge electrode 220.

The ammeter 400 of the resistance measuring apparatus may measure a current flowing between the specimen 100 and the center electrode 210. In some embodiments, the center electrode 210 and the edge electrode 220 may be connected in parallel to the power supply 300, and the ammeter 400 may be installed in series with the wire where the center electrode 210 is located.

Figure 7E:
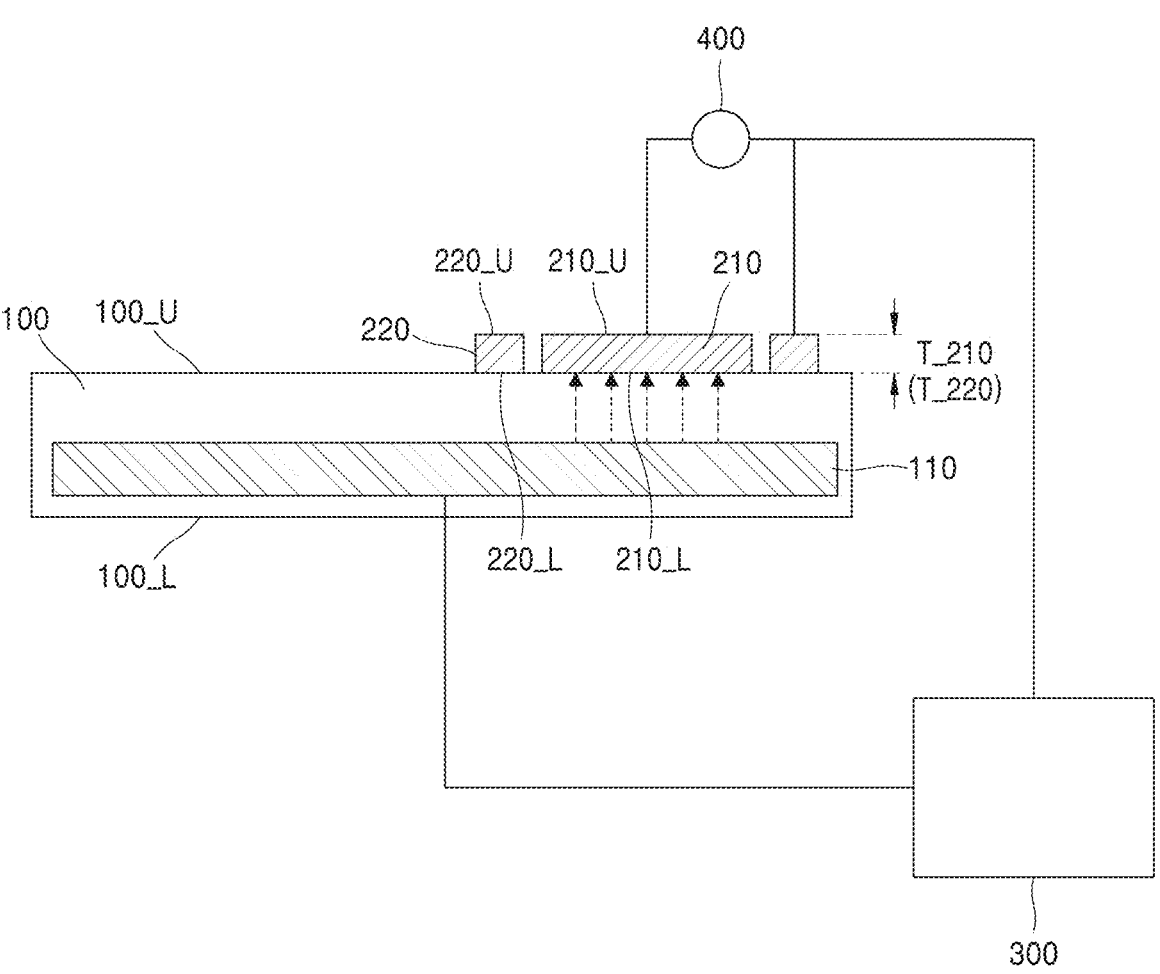

FIG. 7E illustrates a process in which the power supply 300 supplies power to the specimen electrode 110, the center electrode 210, and the edge electrode 220, and the ammeter 400 measures the current flowing between the specimen electrode 110 and the center electrode 210.

Referring to FIG. 7E, the power supply 300 may transmit the current to the specimen electrode 110, the center electrode 210, and the edge electrode 220. In some embodiments, in the power supply 300, a voltage of the edge electrode 220 may be the same as a voltage of the center electrode 210, and a voltage of the specimen electrode 110 may be different from the voltage of the center electrode 210.

In some embodiments, the power supply 300 may transmit direct current to the specimen electrode 110, the center electrode 210, and the edge electrode 220. In some embodiments, the power supply 300 may include a HVDC transmission system. The HVDC transmission system is a system that transmits a large quantity of direct current.

The ammeter 400 of the resistance measuring apparatus may be connected in series to the wire of the center electrode 210 to measure the current flowing from the specimen electrode 110 to the center electrode 210. In FIG. 7E, the current between the specimen electrode 110 and the center electrode 210 according to an embodiment is indicated by an arrow that is a dashed line.

In some embodiments, the sum of areas of the center electrode 210 and the edge electrode 220 may be smaller than an area of the specimen electrode 110. The ammeter 400 may measure current flowing through the specimen 100 positioned between the center electrode 210 and the specimen electrode 110.

The resistance measuring apparatus of the disclosure may calculate the volume resistance of at least a part of the specimen 100 based on the voltage supplied by the power supply 300 and a value measured by the ammeter 400. Specifically, the resistance of the specimen 100 may be calculated through $R=V/I$ which is the Ohm's law. However, an accurate resistance value of the specimen 100 may be calculated by additionally calculating variables such as resistance of each electrode. In addition, the volume resistance of the specimen 100 may be calculated through $Rv=R \cdot A/t$ which is a volume resistance equation. Here, Rv denotes the volume resistance of the specimen 100, R denotes the resistance of the specimen 100, A denotes the area of the upper surface of the center electrode 210, and t may denote a distance from the upper surface of the specimen 100 to an upper surface of the specimen electrode 110. That is, t may be a depth of the specimen electrode 110 buried in the specimen 100.

Figure 7F:
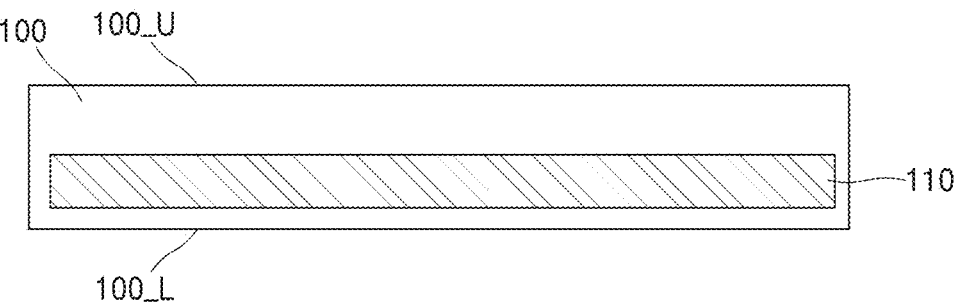

Referring to FIG. 7F, after the volume resistance of the specimen 100 is completely measured, the center electrode 210 and the edge electrode 220 are removed from the upper surface 100_U of the specimen 100.

In some embodiments, a state of the specimen 100 before forming the center electrode 210 and the edge electrode 220 may be a start state, and a state of the specimen 100 before removing the center electrode 210 and the edge electrode 220 may be an end state. The start state and the end state may be substantially the same. That is, the state of the specimen 100 before and after measuring the volume resistance through the resistance measurement method of the disclosure may be substantially the same.

In some embodiments, the specimen 100 may be an apparatus including internal electrodes, such as an ESC. A state of the ESC before and after measuring the volume resistance through the resistance measurement method of the disclosure is substantially the same, so that a function of the ESC may be maintained as it is. In some embodiments, the state of the specimen 100 shown in FIG. 7A before measuring the volume resistance and the state of the specimen 100 shown in FIG. 7F after measuring the volume resistance may be substantially the same.

In some embodiments, in an operation of removing the center electrode 210 and the edge electrode 220, an alkaline solution or an alcohol solution may be sprayed onto the specimen 100. That is, the center electrode 210 and the edge electrode 220 may be removed by the alkaline solution or the alcohol solution. In other words, the center electrode 210 and the edge electrode 220 may be dissolved in the alkaline solution or the alcohol solution, so that the center electrode 210 and the edge electrode 220 may be easily removed from the upper surface of the specimen 100 by the alkaline solution or the alcohol solution.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A method of measuring resistance of a specimen comprising a specimen electrode embedded within the specimen electrode, the method comprising:

forming a center electrode and an edge electrode in at least a partial region on an upper surface of the specimen;

transmitting, by a power supply, current to the specimen electrode, the center electrode, and the edge electrode;

measuring, by an ammeter, the current flowing between the specimen electrode and the center electrode; and a step of removing electrodes from the specimen comprising removing only the center electrode and the edge electrode from the upper surface of the specimen without removing the specimen electrode from the specimen.

2. The method of claim 1, wherein the forming of the center electrode and the edge electrode includes attaching a mask including an electrode pattern to the upper surface of the specimen, and forming the center electrode and the edge electrode on the electrode pattern.

3. The method of claim 2, wherein the forming of the center electrode and the edge electrode includes applying a liquid electrode to the electrode pattern.

4. The method of claim 1, wherein a sum of an area of the center electrode and an area of the edge electrode is smaller than an area of the specimen electrode, and the measuring of the current includes measuring the current flowing through the specimen located between the center electrode and the specimen electrode.

5. The method of claim 1, wherein resistance of the center electrode is about 1000 ohms to about 2000 ohms, and resistance of the edge electrode is about 1000 ohms to about 2000 ohms.

6. The method of claim 1, wherein, in the forming of the center electrode and the edge electrode, the center electrode is formed in a circular shape, and the edge electrode has a ring shape and is formed to surround the center electrode.

7. The method of claim 1, wherein a state of the specimen before forming the center electrode and the edge electrode is a start state, and a state of the specimen after removing the center electrode and the edge electrode is an end state, and the start state of the specimen and the end state of the specimen are the same.

8. The method of claim 1, wherein the removing of the center electrode and the edge electrode includes spraying an alkaline liquid or an alcohol liquid onto the specimen.

9. The method of claim 1, wherein the specimen includes a ceramic electrostatic chuck or a ceramic heater.

10. A resistance measuring apparatus of a specimen comprising a specimen electrode embedded within the specimen, the resistance measuring apparatus comprising:

a center electrode and an edge electrode configured to be detachable from an upper surface of the specimen;

a power supply configured to supply power to the specimen electrode, the center electrode, and the edge electrode; and an ammeter configured to measure current between the specimen, the specimen electrode embedded within the specimen, and the center electrode, wherein the edge electrode is spaced apart from the center electrode and surrounds the center electrode.

11. The resistance measuring apparatus of claim 10, wherein a thickness of the center electrode is about 10 μm to about 800 μm, and a thickness of the edge electrode is about 10 μm to about 800 μm.

12. The resistance measuring apparatus of claim 10, wherein an upper surface of the center electrode is a circular shape, and an upper surface of the edge electrode is ring-shaped.

13. The resistance measuring apparatus of claim 12, wherein a diameter of the upper surface of the center electrode is about 40 mm to about 55 mm.

14. The resistance measuring apparatus of claim 10, wherein an area of an upper surface of the center electrode is smaller than an area of the upper surface of the specimen.

15. The resistance measuring apparatus of claim 10, wherein an area of the specimen electrode is greater than a sum of an area of the center electrode and an area of the edge electrode.

16. The resistance measuring apparatus of claim 10, wherein resistance of the center electrode is about 1000 ohms to about 2000 ohms, and resistance of the edge electrode is about 1000 ohms to about 2000 ohms.

17. The resistance measuring apparatus of claim 10, wherein the center electrode and the edge electrode include at least one of a liquid electrode and a conductive rubber.

18. The resistance measuring apparatus of claim 10, wherein the power supply includes a high voltage direct current (HVDC) transmission system.

19. The resistance measuring apparatus of claim 10, wherein the specimen is a ceramic electrostatic chuck or a ceramic heater.

20. A resistance measuring apparatus of a ceramic specimen comprising a specimen electrode embedded within the specimen, the resistance measuring apparatus comprising:

a center electrode and an edge electrode configured to be detachable from an upper surface of the specimen and formed by applying a liquid electrode in a spray manner, wherein, when attached to the upper surface of the specimen, electrode materials making up the center electrode and the edge electrode are in direct contact with the upper surface of the specimen;

a power supply configured to supply power to the specimen electrode, the center electrode, and the edge electrode; and an ammeter configured to measure current between the specimen and the center electrode, wherein the ceramic specimen comprises a ceramic electrostatic chuck or a ceramic heater, an area of an upper surface of the center electrode is smaller than an area of the upper surface of the specimen, and the edge electrode is spaced apart from the center electrode and surrounds the center electrode.

* * * * *